United States Patent
Nakayama

(10) Patent No.: US 11,810,800 B2
(45) Date of Patent: Nov. 7, 2023

(54) SUBSTRATE SUPPORT, TEST DEVICE, AND METHOD OF ADJUSTING TEMPERATURE OF SUBSTRATE SUPPORT

(71) Applicant: TOKYO ELECTRON LIMITED, Tokyo (JP)

(72) Inventor: Hiroyuki Nakayama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 299 days.

(21) Appl. No.: 17/198,704

(22) Filed: Mar. 11, 2021

(65) Prior Publication Data

US 2021/0296145 A1    Sep. 23, 2021

(30) Foreign Application Priority Data

Mar. 17, 2020    (JP) .................................. 2020-046016

(51) Int. Cl.
  *H01L 21/67*    (2006.01)
  *H01L 21/673*    (2006.01)

(52) U.S. Cl.
  CPC .. *H01L 21/67115* (2013.01); *H01L 21/67109* (2013.01); *H01L 21/67316* (2013.01)

(58) Field of Classification Search
  CPC .......... G01R 31/2865; H01L 21/67109; H01L 21/67115; H01L 21/67316; H05B 3/20; H05B 3/26; H05B 3/265; H05B 41/288; H05B 41/295; H05B 2203/013
  USPC ......................................................... 392/416
  See application file for complete search history.

(56) References Cited

U.S. PATENT DOCUMENTS

2012/0250314 A1* 10/2012 Maikowski ......... C03C 17/2456
                                                              362/326

FOREIGN PATENT DOCUMENTS

JP    2018-151369 A    9/2018
JP    2019-106491 A    6/2019

* cited by examiner

*Primary Examiner* — Sang Y Paik
(74) *Attorney, Agent, or Firm* — Fenwick & West LLP

(57) ABSTRACT

A substrate support includes a top plate portion having a surface on which a substrate is placed; a light irradiation mechanism including light-emitting elements, disposed to face the substrate and heating the substrate using light from the light-emitting elements; a channel-forming member transmitting the light from the light-emitting elements and is bonded to a rear surface of the top plate portion so as to be interposed between the top plate portion and the light irradiation mechanism, and a temperature adjustment part for adjusting a temperature of the channel-forming member by using light having a wavelength absorbed by a light-transmitting material or the channel-forming member. Refrigerant channels are formed between the channel-forming member and the top plate portion, a refrigerant transmitting the light from the light-emitting elements flows through the refrigerant channels, and the top plate portion and the channel-forming member are made of materials having different thermal expansion coefficients.

8 Claims, 6 Drawing Sheets

SUBSTRATE SUPPORT, TEST DEVICE, AND METHOD OF ADJUSTING TEMPERATURE OF SUBSTRATE SUPPORT

CROSS-REFERENCE TO RELATED APPLICATION

This application claims priority to Japanese Patent Application No. 2020-046016, filed on Mar. 17, 2020, the entire contents of which are incorporated herein by reference.

TECHNICAL FIELD

The present disclosure relates to a substrate support, a test device, and a method of adjusting a temperature of a substrate support.

BACKGROUND

Japanese Patent Application Publication No. 2018-151369 discloses a stage on which a substrate having an electronic device formed thereon is placed. The stage includes a disk-shaped stage lid and a cooling unit having a refrigerant groove formed therein. The stage lid is in contact with the cooling unit through an O-ring, the refrigerant groove is covered with the stage lid to form a refrigerant channel, and the O-ring seals a refrigerant in the refrigerant channel. In addition, in the stage disclosed in Patent Document 1, the cooling unit and the refrigerant may transmit light, and a light irradiation mechanism including a plurality of light-emitting diodes (LEDs) is provided to face a wafer through the stage lid and the cooling unit. The cooling unit is made of glass, and the stage lid is made of silicon carbide (SiC).

SUMMARY

The present disclosure is directed to a technique for suppressing warpage of a substrate support formed by bonding members made of materials having different thermal expansion coefficients.

In accordance with an aspect of the present disclosure, there is provided a substrate support on which a substrate is placed. The substrate support comprises: a top plate portion having a surface on which a substrate is placed; a light irradiation mechanism which includes a plurality of light-emitting elements, is disposed to face the substrate placed on the top plate portion, and heats the substrate using light emitted from the light-emitting elements; a channel-forming member which transmits the light emitted from the light-emitting elements and is bonded to a rear surface of the top plate portion so as to be interposed between the top plate portion and the light irradiation mechanism. Further, refrigerant channels are formed between the channel-forming member and the top plate portion, a refrigerant which transmits the light emitted from the light-emitting elements flows through the refrigerant channels, and the top plate portion and the channel-forming member are made of materials having different thermal expansion coefficients; and a temperature adjustment part for adjusting a temperature of the channel-forming member by using light having a wavelength absorbed by a light-transmitting material or the channel-forming member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
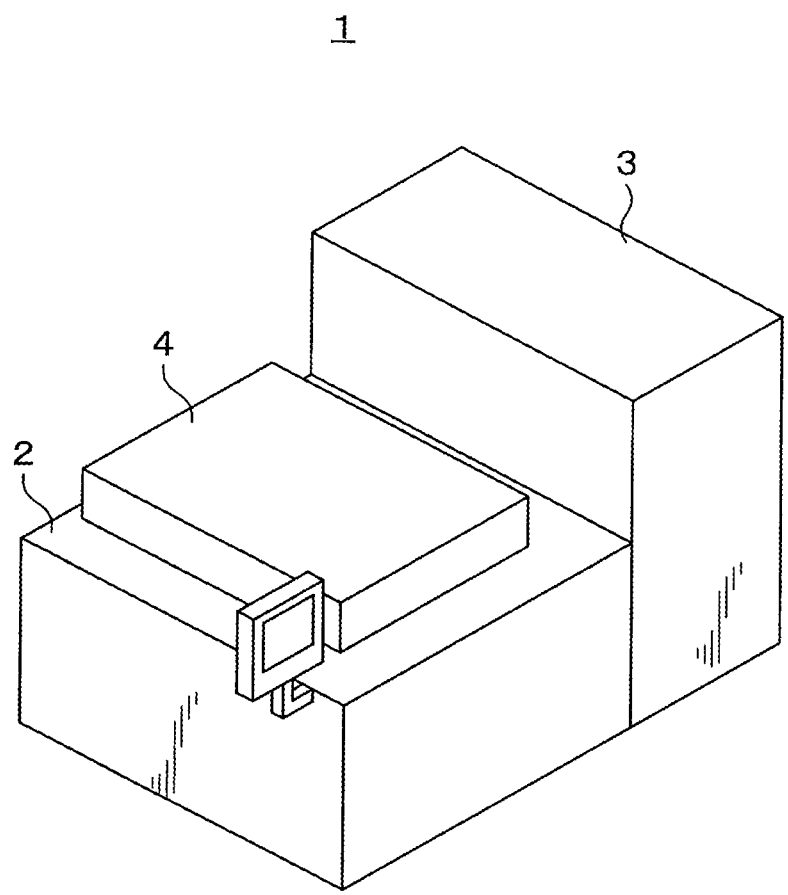
FIG. 1 is a schematic perspective view illustrating a configuration of a prober as a test device including a stage that is a substrate support according to the present embodiment.

In a semiconductor manufacturing process, a plurality of electronic devices having a predetermined circuit pattern are formed on a substrate such as a semiconductor wafer (hereinafter, referred to as "wafer"). The electronic devices so formed are tested with regard to electrical characteristics thereof and classified into a non-defective product or a defective product. The test of the electronic devices is performed using a test device, for example, while they are still on the substrate before division into individual electronic device.

A test device referred to as a prober or the like (hereinafter, referred to as "prober") includes a probe card having a plurality of probes, and a substrate support on which a substrate is placed. At the time of a test, in the prober, each probe of the probe card comes in contact with each electrode of the electronic device, and in that state, a tester provided above the probe card supplies an electrical signal to the electronic device through each probe. It is determined whether the electronic device is a defective product based on the electrical signal received by the tester from the electronic device through each probe.

When the electrical characteristics of the electronic device are tested by such type of prober, in order to simulate an environment in which the electronic device is mounted, a temperature of the substrate support and a temperature of the substrate are controlled by a heater having a resistance heating element or by a channel in which a refrigerant flows, provided on the substrate support.

In recent years, as electronic devices have become faster and smaller, the degree of integration thereof has increased, and, thus, the amount of heat generated during operation has significantly increased. Therefore, during a test of an electronic device on a substrate, a heat load may be applied to other electronic devices adjacent thereto, which may cause a problem in the other electronic devices.

In relation to the problem, Patent Document 1 discloses the following stage, that is, a substrate support. The stage disclosed in Patent Document 1 includes a disk-shaped stage lid and a cooling unit having a refrigerant groove formed therein. The stage lid is in contact with the cooling unit through an O-ring, the refrigerant groove is covered with the stage lid to form a refrigerant channel, and the O-ring seals a refrigerant in the refrigerant channel. A light irradiation mechanism including a plurality of light-emitting diodes (LEDs) is provided to face a wafer through the stage lid and the cooling unit. In addition, the cooling unit and the refrigerant may transmit light so that light emitted from the LED passes through the cooling unit and the like and reaches the stage lid. Furthermore, the light irradiation mechanism may locally irradiate the stage lid with the light emitted from the LED. Due to such configuration, the stage disclosed in Patent Document 1 emits light locally onto the stage lid to only heat the stage lid while cooling the entire stage lid using the cooling unit, thereby cooling other electronic devices while controlling the temperature of a desired electronic device.

Conventionally, silicon carbide (SiC) having high thermal conductivity has been used as a material for a stage lid (that is, a material for a top plate portion of a stage) because light emitted from an LED can be easily used for heating, and glass, which is an inexpensive transparent member, has been used for a channel-forming member that forms a refrigerant channel together with the top plate portion. Specifically, glass, which is capable of transmitting light emitted from the LED and has a thermal expansion coefficient different from that of SiC used as a material for the top plate portion, has been conventionally used as the material for the channel-forming member.

In some cases, in order to seal a refrigerant channel, a top plate portion and a channel-forming member may be bonded by using an epoxy resin or the like. In the case that the top plate portion and the channel-forming member are bonded by using the epoxy resin or the like, if the materials of the top plate portion and the channel-forming member have different thermal expansion coefficients as described above, a stage may be warped when a test is performed in a temperature zone significantly different from a temperature at the time of bonding. As such, if the stage is warped, for example, each probe of a probe card cannot be in uniform contact with a substrate on the stage, which may adversely affect test quality.

Therefore, the technique according to the present disclosure suppresses warpage of a substrate support formed by way of bonding members made of materials having different thermal expansion coefficients.

Hereinafter, a substrate support, a test device, and a method of adjusting warpage of the substrate support according to the present embodiment will be described with reference to the accompanying drawings. In the present specification and the drawings, elements having substantially the same function or structure are referred to by like reference numerals, and repeated descriptions thereof will be omitted.

Figure 2:
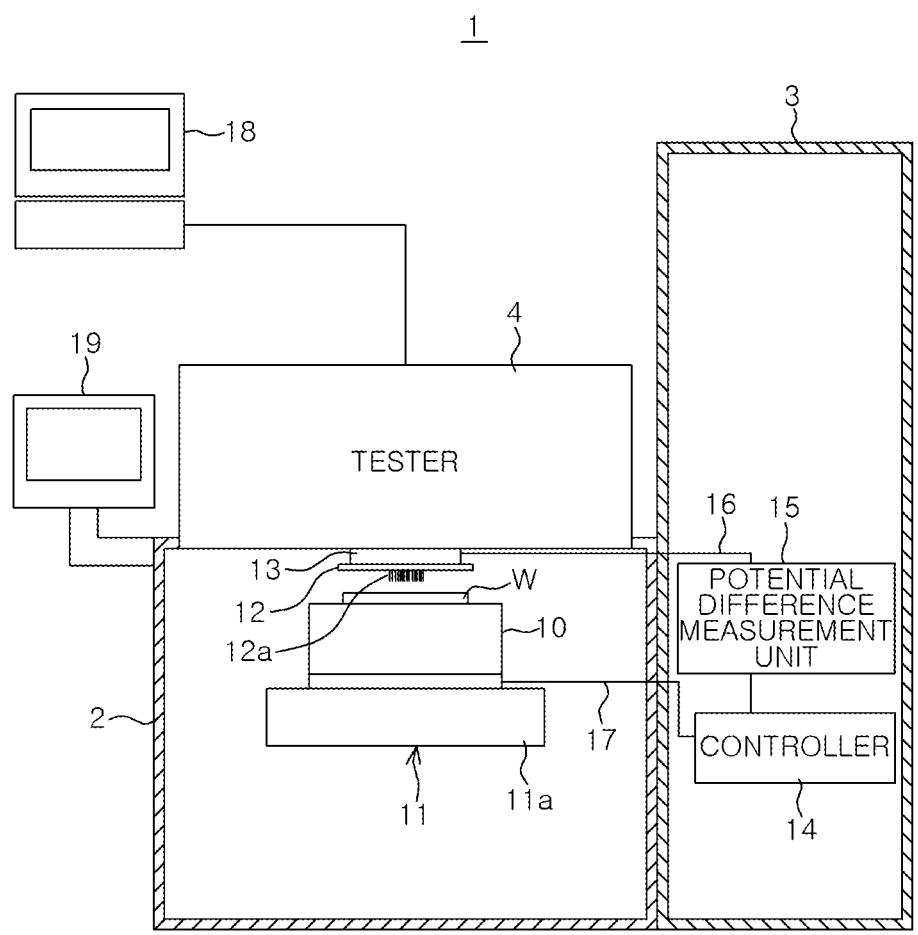
FIG. 2 is a schematic front view showing the configuration of the prober as the test device including the stage that is the substrate support according to the present embodiment.

FIGS. 1 and 2 are a schematic perspective view and a schematic front view, respectively, illustrating a configuration of a prober 1 as a test device including a stage as a substrate support according to the present embodiment. FIG. 2 illustrates certain components of an accommodation chamber and a loader of the prober 1 of FIG. 1 to be described below, and, thus, a cross section view thereof is presented.

The prober 1 of FIGS. 1 and 2 tests the electrical characteristics of a wafer W, i.e., a substrate and a test target in the present embodiment. Specifically, the prober 1 tests the electrical characteristics of each of a plurality of electronic devices formed on the wafer W (see reference numeral D of FIG. 3 described below). The prober 1 includes an accommodation chamber 2 for accommodating the wafer W at the time of a test, a loader 3 disposed adjacent to the accommodation chamber 2, and a tester 4 disposed to cover the accommodation chamber.

The accommodation chamber 2 is a housing, the inside of which is hollow, and includes a stage 10 on which the wafer W is mounted.

The stage 10 vacuum-holds the wafer W such that a position of the wafer W is not misaligned with respect to the stage 10. In addition, the stage 10 is provided with a moving mechanism 11 for laterally and vertically moving the stage 10. The moving mechanism 11 includes a base 11a made of a metal material such as stainless steel, on which the stage 10 is disposed, and also includes a guide rail, a ball screw, and a motor for moving the base 11a (not shown). Through the moving mechanism 11, the relative positions of a probe card 12 to be described below and the wafer W may be adjusted so that probes 12a of the probe card 12 may be brought into contact with electrodes on a surface of the wafer W.

The probe card 12 including the plurality of probes 12a as contact terminals is disposed above the stage 10 so as to face the stage 10 in the accommodation chamber 2. The probe card 12 is connected to the tester 4 through an interface 13. Each probe 12a is in contact with an electrode of each electronic device of the wafer W at the time of testing electrical characteristics of the electronic device, supplies electric power from the tester 4 to the electronic device through the interface 13, and transmits a signal from the electronic device to the tester 4 through the interface 13.

The loader 3 takes out the wafer W accommodated in a front opening unified pod (FOUP) (not shown), which is a transport container, and transfers the wafer W to the stage 10 of the accommodation chamber 2. In addition, the loader 3 receives the wafer W from the stage 10 after the test of the electrical characteristics of the electronic devices thereon has been completed, and accommodates the wafer W in the FOUP.

Furthermore, the loader 3 includes a controller 14 that performs various types of control, such as control of a temperature of the electronic device to be tested. The controller 14, also referred to as a base unit or the like, is composed of, for example, a computer provided with a central processing unit (CPU), a memory, and the like, and also includes a program storage unit (not shown). The program storage unit stores programs that control various processes in the prober 1. The program may be recorded on a computer-readable storage medium and may be installed in the controller 14 from the storage medium. Some or all of the programs may also be realized with dedicated hardware (circuit board).

In addition, the loader 3 includes a potential difference measurement unit 15 for measuring a potential difference in a potential difference generation circuit (not shown) in the electronic device. The potential difference generation circuit is, for example, a diode, a transistor, or a resistor. The potential difference measurement unit 15 is connected to the interface 13 through a wire 16, acquires a potential difference between two probes 12a that are in contact with two electrodes corresponding to the potential difference generation circuit, and transmits the acquired potential difference to the controller 14. The connection structure of each probe 12a and the wire 16 in the interface 13 will be described below. The controller 14 is connected to the stage 10 through a wire 17 and controls a flow rate control valve that adjusts the flow rate of a refrigerant in a light irradiation mechanism 140 to be described below or in refrigerant channels R described below. The controller 14 or the potential difference measurement unit 15 may be provided in the accommodation chamber 2, and the potential difference measurement unit 15 may be provided in the probe card 12.

The tester 4 includes a test board (not shown) that implements a certain portion of a circuit configuration of a motherboard on which an electronic device is mounted. The test board is connected to a tester computer 18 that determines whether the electronic device is defective or non-defective based on a signal from the electronic device. In the tester 4, circuit configurations of a plurality of types of motherboards can be implemented by replacing the test board.

In addition, the prober 1 includes a user interface unit 19 on which information is displayed for a user or through which the user inputs an instruction. The user interface unit 19 includes, for example, an input unit such as a touch panel or a keyboard, and a display unit such as a liquid crystal display.

In the prober 1 including the above-described components, when the electrical characteristics of the electronic device are tested, the tester computer 18 transmits data to the test board connected to the electronic device through each probe 12a. The tester computer 18 determines whether the transmitted data has been correctly processed by the test board based on an electrical signal from the test board.

Figure 3:
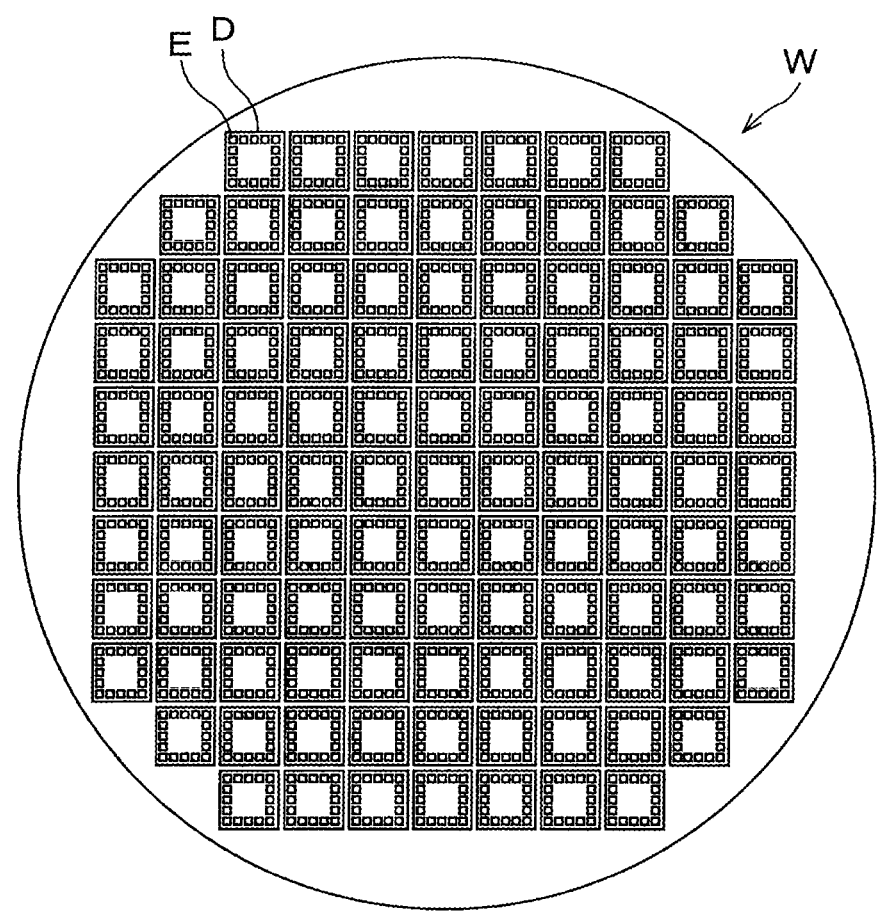
FIG. 3 is a schematic plan view representing a configuration of a wafer.

Next, the wafer W to be tested by the prober 1 will be described with reference to FIG. 3. FIG. 3 is a schematic plan view depicting a configuration of the wafer W.

As shown in FIG. 3, the plurality of electronic devices D have been formed on the surface of the wafer W at predetermined intervals by performing an etching process or an interconnection process on a substantially disk-shaped silicon substrate. Electrodes E are formed on a surface of the wafer W, i.e., on the electronic device D. The electrode E is electrically connected to a circuit element inside the electronic device D. By applying a voltage to the electrode E, a current may flow in the circuit element inside each electronic device D. The size of the electronic device D is, for example, 10 mm to 30 mm square in a plan view.

Figure 4:
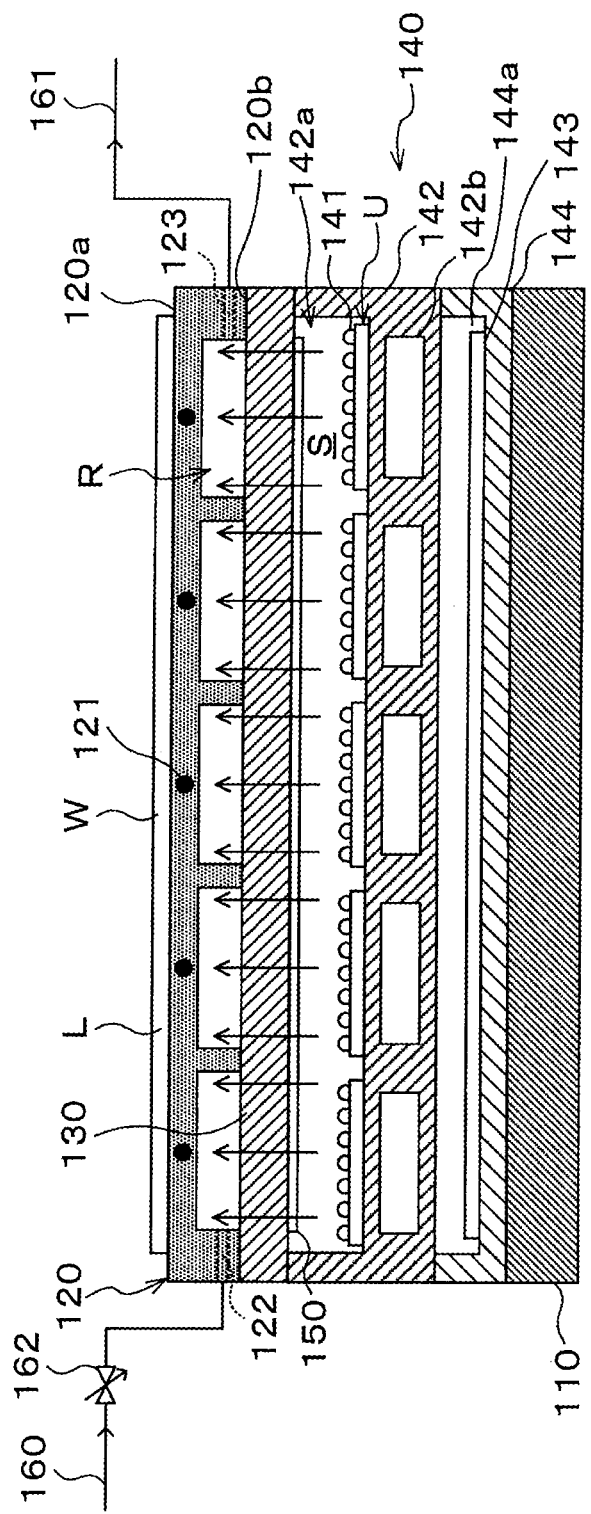
FIG. 4 is a schematic cross-sectional view describing a configuration of the stage.
Figure 5:
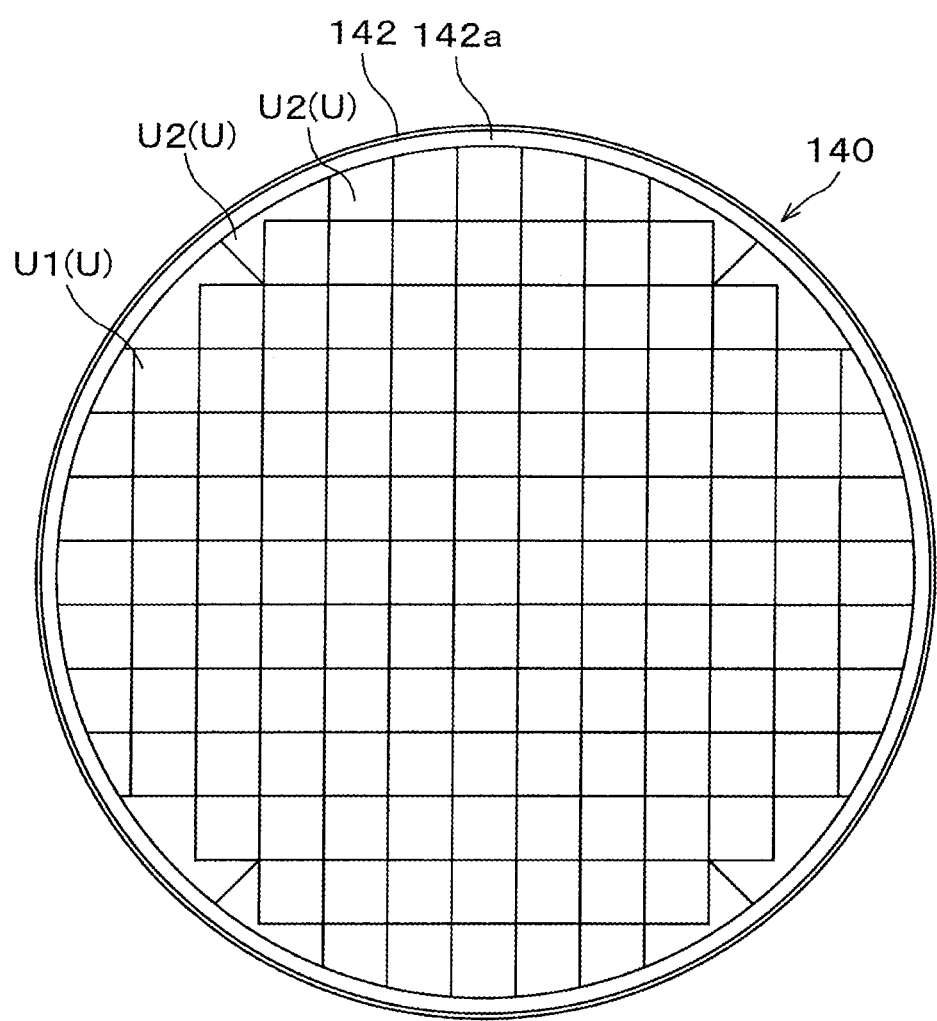
FIG. 5 is a schematic plan view depicting a configuration of a light irradiation mechanism.

Next, the configuration of the stage 10 will be described with reference to FIGS. 4 and 5. FIG. 4 is a schematic cross-sectional view representing the configuration of the stage 10, and FIG. 5 is a schematic plan view showing a configuration of the light irradiation mechanism 140 to be described below.

As shown in FIG. 4, the stage 10 is formed by stacking a plurality of functional parts including a top plate 120 as a top plate portion. The stage 10 is mounted on the moving mechanism 11 (see FIG. 2) for laterally and vertically moving the stage 10 with a heat insulating member 110 interposed therebetween. The heat insulating member 110 is for thermally insulating the stage 10 from the moving mechanism 11 and is made of, for example, a sintered body of cordierite having low thermal conductivity and a low thermal expansion coefficient. Both the base 11a of the moving mechanism 11 and the heat insulating member 110 are solid bodies.

The stage 10 includes the top plate 120, the channel-forming member 130, and the light irradiation mechanism 140 in this order from the top. The stage 10 is supported by the moving mechanism 11, with the heat insulating member 110 interposed therebetween, from a lower portion of the light irradiation mechanism 140, in other words, from a rear surface of the light irradiation mechanism 140.

The top plate 120 is a member on which the wafer W is placed. To put it another way, the top plate 120 is a member, a surface 120a of which is a wafer supporting surface serving as a substrate supporting surface on which the wafer W is placed. Hereinafter, in some cases, the surface 120a of the top plate 120, which is also an upper surface of the stage 10, will be referred to as the wafer supporting surface 120a.

The top plate 120 is formed, for example, in a disk shape. In addition, the top plate 120 is made of a material having low specific heat and high thermal conductivity, for example, silicon carbide (SiC). When the top plate 120 is made of the above-described material, the top plate 120 can be efficiently heated and cooled, and, thus, the wafer W placed on the top plate 120 can be efficiently heated or cooled. Hereinafter, it is assumed that the top plate 120 is made of SiC.

SiC has a high Young's modulus of 300 GPa. Therefore, by forming the top plate 120 with SiC, it is possible to prevent the top plate 120 from being cracked or the like Suction holes (not shown) for vacuum-attracting the wafer W are formed in the wafer supporting surface 120a of the top plate 120. In addition, a plurality of temperature sensors 121 are embedded in the top plate 120 at positions spaced apart from each other in a plan view.

The channel-forming member 130 is a member that is bonded to the rear surface of the top plate 120 so as to be interposed between the top plate 120 and the light irradiation mechanism 140 and forms the refrigerant channels R in which the refrigerant flows between the light irradiation mechanism and the top plate 120. The channel-forming member 130 is formed in a disk shape having substantially the same diameter as the top plate 120.

Meanwhile, grooves are formed in a rear surface 120b of the top plate 120 on which the channel-forming member 130 is mounted, and the grooves are covered with the channel-forming member 130 to form the refrigerant channels R. In the prober 1, the top plate 120 is cooled by the refrigerant flowing in the refrigerant channels R, thereby cooling the wafer W placed on the top plate 120, that is, on the stage 10, and specifically, thereby cooling the electronic devices formed on the wafer W.

In addition, a supply port 122 and a discharge port 123 communicating with the refrigerant channel R are formed in the top plate 120. A supply pipe 160 for supplying the refrigerant to the refrigerant channel R is connected to the supply port 122, and a discharge pipe 161 for discharging the refrigerant from the refrigerant channel R is connected to the discharge port 123. The supply pipe 160 is provided with a flow rate control valve 162 that controls the flow rate of the refrigerant supplied to the refrigerant channel R.

A material capable of transmitting light (specifically, light emitted from LEDs 141 described below), for example, a fluorine-based inert liquid (Fluorinert™ (registered trademark), Novec™ (registered trademark), or the like) is used as the refrigerant flowing in the refrigerant channel R, and the refrigerant is supplied to the refrigerant channel R through the supply pipe 160 by a pump (not shown) provided outside the prober 1. The operation of the flow rate control valve 162 or the like for adjusting the flow rate of the refrigerant is controlled by the controller 14.

As a material of the channel-forming member 130 constituting the refrigerant channel R as described above, a material capable of transmitting light (specifically, light emitted from the LED 141 described below) is used. In the following examples, it is assumed that the channel-forming member 130 is made of glass.

In addition, the channel-forming member 130 and the top plate 120 are bonded such that the refrigerant is sealable in the refrigerant channel R. The bonding is performed using, for example, an epoxy resin. More specifically, an epoxy resin is applied between the channel-forming member 130 and the top plate 120, and the channel-forming member 130 and the top plate 120 are pressed against each other and heated to a predetermined temperature (for example, 100° C.), thereby performing the bonding.

The light irradiation mechanism 140 is disposed to face the wafer W placed on the wafer supporting surface 120a of the top plate 120 with the channel-forming member 130 interposed therebetween.

The light irradiation mechanism 140 includes the plurality of LEDs 141 as light-emitting elements facing the wafer W and heats the wafer W with light emitted from the LEDs 141. Specifically, the light irradiation mechanism 140 includes a plurality of LED units U, each having a plurality of LEDs 141 that are unitized, and also includes a base 142 on which the LED units U are mounted. For example, as shown in FIG. 5, the LED units U in the light irradiation mechanism 140 substantially cover the entire surface of the base 142 with the LED units U includes planar rectangular-shaped units U1 and planar nonrectangular-shaped units U2. The rectangular-shaped units U1 are arranged in the same manner as the electronic devices D (see FIG. 3) formed on the wafer W, the number of the rectangular-shaped units U1 is the same as that of the electronic devices D, and the nonrectangular-shaped units U2 cover the outer circumference of the planar rectangular-shaped units U1. As a result, the light emitting from the LEDs 141 of the LED unit U may be emitted onto at least the entirely of a portion of the top plate 120 in contact with the wafer W.

Each LED 141 emits light toward the wafer W. In the present example, each LED 141 emits near-infrared light. The light emitted from the LEDs 141 (hereinafter, in some cases, simply referred to as "LED light") passes through the channel-forming member 130 of the stage 10, which is made of a light-transmitting member. The light passing through the channel-forming member 130 passes through a refrigerant capable of transmitting light, which flows in the refrigerant channel R of the stage 10, and is incident on the top plate 120.

In a plan view, the base 142 is formed in a disk shape having substantially the same diameter as the top plate 120. Furthermore, as shown in FIG. 4, the base 142 has a concave portion 142a formed in a surface thereof, and the LEDs 141 are mounted in the concave portion 142a. The concave portion 142a may be filled with a material capable of transmitting LED light.

In addition, the base 142 has a cooling water channel 142b, through which cooling water as a refrigerant for cooling the LEDs 141 flows, in a portion closer to a rear surface of the base 142 than the concave portion 142a. The base 142 is made of a metal material such as aluminum (Al).

In addition, the light irradiation mechanism 140 includes a driving circuit board 143 for driving the LEDs 141 and a support member 144 on which the driving circuit board 143 is mounted.

A concave portion 144a is formed on a surface of the support member 144, and the driving circuit board 143 is mounted in the concave portion 144a. The support member 144 is made of a metal material such as Al.

In the light irradiation mechanism 140, LED light, incident on the top plate 120 on which the wafer W is placed, is controlled for each of the LED units U. Therefore, the light irradiation mechanism 140 can emit the LED light only onto a certain portion on the top plate 120 and can make the intensity of light irradiated onto a certain portion different from the intensity of light irradiated onto other portions. Therefore, the light irradiation mechanism 140 can locally heat the wafer W placed on the top plate 120 or may locally change how much the wafer W is to be heated.

In addition, the stage 10 includes a transparent heater 150. The transparent heater 150 is an example of a temperature adjustment part that is made of a material capable of transmitting light and controls the temperature of the channel-forming member 130. The transparent heater 150 is a resistance heating heater made of a conductive material capable of transmitting LED light (for example, light having a wavelength of 850 nm). Examples of the conductive material include indium tin oxide (ITO), indium zinc oxide (IZO), zinc oxide (ZnO), and IGZO (oxide semiconductor composed of indium (In), gallium (Ga), and zinc (Zn)).

The transparent heater 150 is provided on the channel-forming member 130, and specifically, the transparent heater 150 is provided on a surface of the channel-forming member 130 opposite to the top plate 120, that is, on a rear surface of the channel-forming member 130. In this case, the transparent heater 150 is formed through, for example, a sputtering method or a deposition method. Formation of the transparent heater 150 through the sputtering method or the like is performed in advance, for example, before the top plate 120 and the channel-forming member 130 are bonded.

The formation position of the transparent heater 150 is not limited to the rear surface of the channel-forming member 130 and may be inside the rear surface of the channel-forming member 130.

In addition, a temperature sensor (not shown) for measuring a temperature of the channel-forming member 130 is provided around the transparent heater 150.

The transparent heater 150 heats the channel-forming member 130 so as to absorb a difference in thermal expansion coefficients of the top plate 120 made of SiC and the channel-forming member 130 made of glass having a thermal expansion coefficient different from that of SiC. In other words, the transparent heater 150 heats the channel-forming member 130 such that the stage 10 is not warped, and more specifically, the transparent heater 150 heats the channel-forming member 130 such that the top plate 120 is not warped.

Heating of the channel-forming member 130 by the transparent heater 150, that is, a current passage amount in the transparent heater 150, is controlled by the controller 14.

The controller 14 controls the transparent heater 150 such that the temperature of the channel-forming member 130 measured by the above-described temperature sensor (not shown) provided around the transparent heater 150 becomes the temperature $T_H$ of the channel-forming member 130 at which the top plate 120 is not warped. The temperature $T_H$ of the channel-forming member 130 at which the top plate 120 is not warped is calculated by the controller 14, for example, based on operating conditions of the stage 10. More specifically, the temperature $T_H$ of the channel-forming member 130 at which the top plate 120 is not warped is calculated by the controller 14 based on the temperature $T_{TP}$ of the top plate 120, the temperature $T_{cool}$ of a refrigerant flowing in the refrigerant channel R, and the temperature $T_{LED-C}$ of cooling water flowing in the cooling water channel 142b for cooling the LED 141. A relational expression between $T_H$, $T_{TP}$, $T_{cool}$, and $T_{LED-C}$, that is, a function $f(T_{TP}, T_{cool}, T_{LED-C})$ used for the calculation is acquired in advance and stored in a storage unit (not shown).

$$T_H = f(T_{TP}, T_{cool}, T_{LED-C})$$

For the temperature $T_{TP}$, for example, an average value of results detected by the temperature sensor 121 can be used. A temperature sensor may be provided to measure the temperature $T_{cool}$ and the temperature $T_{LED-C}$, and when the temperature $T_{cool}$ and the temperature $T_{LED-C}$ are constant, the temperature $T_{cool}$ and the temperature $T_{LED-C}$ may be stored in advance in the storage unit (not shown) and read from the storage unit when the temperature $T_H$ is calculated.

In the prober 1, the temperature of the electronic device D to be tested formed on the wafer W on the stage 10 is controlled to be constant at a target temperature through the heating by light emitted from the light irradiation mechanism 140 and through the heat absorption by the refrigerant flowing in the refrigerant channel R. For the temperature control, the prober 1 measures the temperature of the electronic device D.

Figure 6:
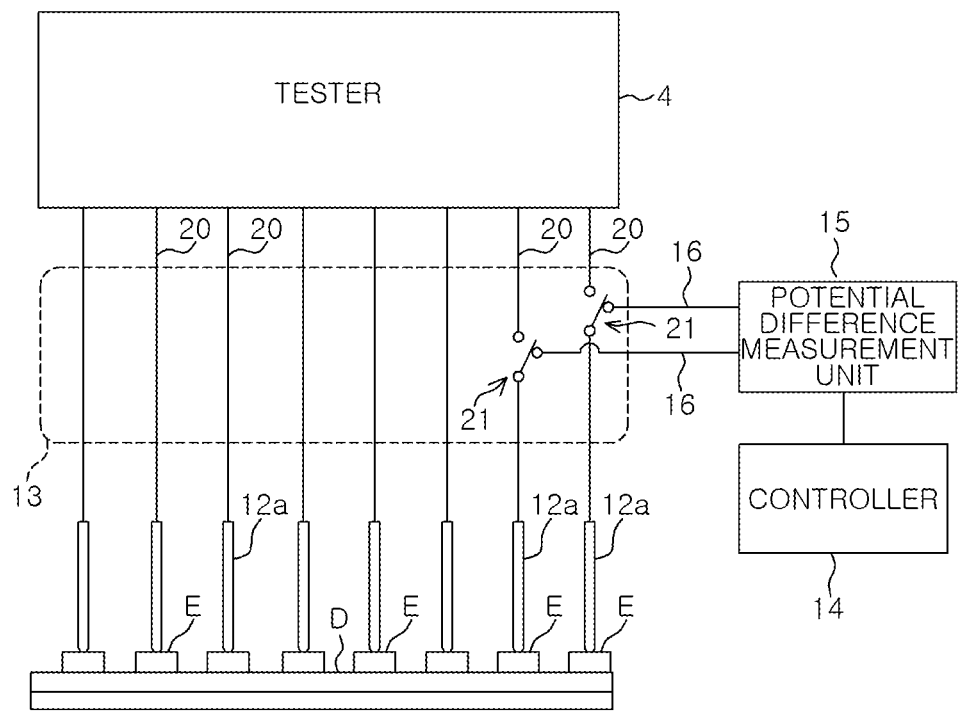
FIG. 6 is a schematic view explaining a configuration of a circuit for measuring the temperature of a wafer in the test device of FIG. 1.

FIG. 6 is a schematic diagram illustrating a configuration of a circuit for measuring the temperature of the electronic device D in the prober 1.

In the prober 1, as shown in FIG. 6, the probes 12a are connected to the tester 4 through a plurality of wires 20 disposed at the interface 13. In addition, a relay 21 is provided in each of the two wires 20, among the wires 20, connecting the tester 4 and two probes 12a in contact with two electrodes E of the potential difference generation circuit (for example, a diode) in the electronic device D.

Each relay 21 may be configured to switch between the tester 4 and the potential difference measurement unit 15 and transmit thereto the potential difference of each electrode E. For example, when the electrical characteristics of the electronic device D are tested, after the mounting voltage is applied on each electrode E, each relay 21 transmits the potential of each electrode E to the potential difference measurement unit 15 at a predetermined timing. In the above-described potential difference generation circuit, a potential difference generated by a current flow differs depending on a temperature. Therefore, the temperature of the electronic device D can be measured in real time during a test based on a potential difference of the potential difference generation circuit of the electronic device D, that is, a potential difference between the two electrodes E (probe 12a) of the potential difference generation circuit. In the prober 1, the potential difference measurement unit 15 acquires the potential difference of the potential difference generation circuit of the electronic device D based on the potential of each electrode E transmitted from each relay 21. In addition, the potential difference measurement unit 15 transmits the acquired potential difference to the controller 14. The controller 14 measures the temperature of the electronic device D based on the transmitted potential difference and the temperature characteristics of the potential difference of the potential difference generation circuit.

A method of measuring the temperature of the electronic device D is not limited to the one described above, and other methods may be used as long as the temperature of the electronic device D may be measured.

Next, an example of processing the wafer W using the prober 1 will be described.

First, the wafer W is taken out of the FOUP of the loader 3, transferred toward the stage 10, and placed on the wafer supporting surface 120a of the top plate 120. Subsequently, the stage 10 is moved to a predetermined position.

All the LEDs 141 of the light irradiation mechanism 140 are turned on, and light output from the LEDs 141 and the flow rate of a refrigerant flowing in the refrigerant channel R are adjusted based on information acquired from the temperature sensor 121 of the top plate 120 such that the temperature of the top plate 120 is made uniform at a surface thereof.

Then, the stage 10 is moved, and each probe 12a provided above the stage 10 is brought into contact with the electrode E of the electronic device D to be tested of the wafer W.

In this state, the potential difference measurement unit 15 acquires a potential difference of the above-described potential difference generation circuit in the electronic device D to be tested. The potential difference is calibrated such that the temperature of the top plate 120 made uniform on the surface thereof substantially matches the temperature of the electronic device D to be tested, that is, information on temperature characteristics of the potential difference is corrected.

Thereafter, a signal for a test is input to each probe 12a. As a result, a test of the electronic device D is started. Meanwhile, based on information on a potential difference generated in the potential difference generation circuit of the electronic device D to be tested during the test, for example, light output from the LEDs 141 of the LED unit U corresponding to the electronic device, that is, a voltage applied to the LEDs 141, is controlled such that the temperature of the electronic device D becomes a test temperature or a target temperature. In addition, the temperature and the flow rate of a refrigerant in the refrigerant channel R are constant at a value corresponding to the test temperature or the target temperature of the electronic device D to be tested.

Then, processes of correcting and testing the potential difference of the above-described potential difference generation circuit are repeatedly performed until the test of all electronic devices D is completed.

In addition, the channel-forming member 130 is heated by the transparent heater 150 such that the top plate 120 is not warped between the above-described processes of correcting and testing the potential difference of the potential difference generation circuit. For example, the controller 14 calculates the temperature $T_H$ of the channel-forming member 130, at which the top plate 120 is not warped, based on an average value of the temperatures $T_{TP}$ of the top plate 120 measured by the temperature sensor 121, the temperature $T_{cool}$ of the refrigerant flowing in the refrigerant channel R, and the temperature $T_{LED-C}$ of the cooling water flowing in the cooling water channel 142b for cooling the LED 141. The controller 14 controls the transparent heater 150 such that the temperature of the channel-forming member 130 measured by the temperature sensor (not shown) provided around the transparent heater 150 becomes the temperature $T_H$.

As such, the top plate 120 is not warped during the above-described calibration and test of the potential difference of the potential difference generation circuit, and, thus, the wafer W vacuum-held by the top plate 120 is in uniform contact with the probes 12a of the probe card 12. Therefore, the above-described calibration and test can be performed accurately.

The processing of the wafer W using the prober 1 may include a process of photographing the surface of the wafer W on the top plate 120 using an imaging device (not shown) provided in the accommodation chamber 2. For example, in a process of aligning positions of the probe 12a and the wafer W and a process of checking a mark of the probe 12a, that is, a needle mark after the test, the electrode E on the wafer W is photographed by the imaging device. As described above, in the process of performing the photographing, the LEDs 141 may not be turned on. Even when the LEDs 141 are not turned on, the top plate 120 may be warped. When the top plate 120 is being warped during the photographing, the electrode of the top plate 120 may not be in focus unless the height of the imaging device is changed. Thus, when the top plate 120 is being warped, the process of aligning the positions or the process of checking the needle mark takes a long time. Therefore, even in these processes, the controller 14 may control the transparent heater 150 such that the temperature of the channel-forming member 130 measured by the temperature sensor (not shown) provided around the transparent heater 150 becomes the temperature $T_H$ of the channel-forming member 130 at which the top plate 120 is not warped. As a result, it is possible to prevent the processes from taking a long time.

As described above, in the present embodiment, the stage 10 includes the top plate 120 having a surface on which the wafer W is placed, the channel-forming member 130 capable of transmitting light, which is bonded to the rear surface 120b of the top plate 120 and forms the refrigerant channels R in which a refrigerant capable of transmitting light flows between the channel-forming member 130 and the top plate 120, and the light irradiation mechanism 140 which includes the plurality of LEDs 141, is disposed to face the wafer W placed on the top plate 120 with the channel-forming member 130 interposed therebetween, and heats the wafer W with light emitting from the LED 141. Therefore, the stage 10 locally emits LED light onto the top plate 120 to heat the top plate 120 while cooling the entire top plate 120 with the refrigerant flowing in the refrigerant channel R, thereby cooling other electronic devices while controlling the temperature of a desired electronic device. In the stage 10, the top plate 120 and the channel-forming member 130 are made of materials having different thermal expansion coefficients, and the stage 10 may be warped. Specifically, the top plate 120 may be warped. Thus, the transparent heater 150 is provided as a temperature adjustment part that is made of a material capable of transmitting light and controls the temperature of the channel-forming member. Therefore, according to the present embodiment, the temperature of the channel-forming member 130 is adjusted using the transparent heater 150, thereby preventing the top plate 120 from being warped. In addition, according to the present embodiment, since the top plate 120 is not warped, the plurality of probes 12a can be in uniform contact with the electronic devices D, thereby accurately testing the electrical characteristics or the like using the probe card 12 including the plurality of probes 12a. Furthermore, the stage 10 can be used in a wide test temperature range because the top plate 120 is not warped regardless of a temperature of the top plate 120, that is, regardless of a test temperature.

In the above-described example, the controller 14 calculated the temperature $T_H$ of the channel-forming member 130, at which the top plate 120 is not warped, based on operating conditions of the stage 10 such as the temperature $T_{TP}$ of the top plate 120, the temperature $T_{cool}$ of the refrigerant flowing in the refrigerant channel R, and the temperature $T_{LED-C}$ of the cooling water flowing in the cooling water channel 142b for cooling the LEDs 141. Specifically, the controller 14 calculated and acquired the temperature $T_H$ based on the function $f(T_{TP}, T_{cool}, T_{LED-C})$. The operating conditions of the stage 10 used for calculating the temperature $T_H$ are not limited to such a combination and may be, for example, based only on the temperature $T_{TP}$ of the top plate 120 and the temperature $T_{cool}$ of the refrigerant flowing in the refrigerant channel R. In other words, the calculation of the temperature $T_H$ by the controller 14 may be performed using a function $f(T_{TP}, T_{cool})$ based on the temperature $T_{TP}$ of the top plate 120 and the temperature $T_{cool}$ of the refrigerant flowing in the refrigerant channel R.

In addition, in the above-described example, the temperature $T_H$ of the channel-forming member 130 at which the top plate 120 is not warped has been calculated and acquired based on the operating conditions of the stage 10. A method for acquiring the temperature $T_H$ is not limited thereto, and for example, the temperature $T_H$ may be acquired as follows. That is, the temperature $T_H$ of the channel-forming member 130, at which the top plate 120 is not warped, is determined in advance for each operating condition of the stage 10 and is stored in the storage unit (not shown). At the time of a test, the controller 14 may acquire the temperature $T_H$ by reading the temperature $T_H$, which meets an operating condition of the stage 10 at the time of the test, from the storage unit. More specifically, for example, different temperatures $T_H$ for a case where the LEDs 141 are turned on and a case where the LEDs 141 are turned off may be determined in advance and stored in the storage unit, and the controller 14 may select the temperature $T_H$ to be read from the storage unit according to whether the LEDs 141 are turned on or off. Even through such a method, it is possible to prevent the top plate 120 from being warped regardless of a predicted amount of the warpage of the top plate 120.

Figure 7:
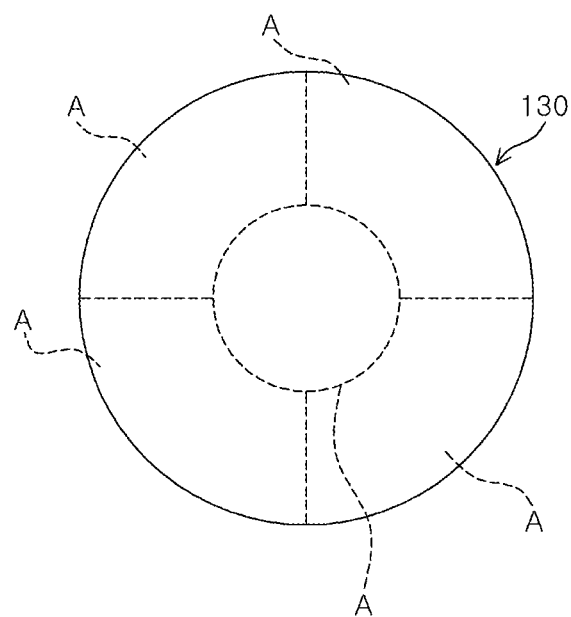
FIG. 7 is a view for describing an example of controlling a transparent heater.

FIG. 7 is a view for describing an example of controlling the transparent heater 150.

As shown in FIG. 7, the channel-forming member 130 may be divided into a plurality of regions A (five in the present example), and the controller 14 may control a heating amount of the channel-forming member 130 by the transparent heater 150 for each region A. Specifically, for example, a temperature sensor (not shown) is provided around the transparent heater 150 for each region A of the channel-forming member 130. The controller 14 calculates the temperature $T_H$ of the channel-forming member 130, at which the top plate 120 is not warped, from the above-described function $f(T_{TP}, T_{cool}, T_{LED-C})$ based on the temperature $T_{TP}$ of the top plate 120, which corresponds to the corresponding region A, measured by the temperature sensor 121, the temperature $T_{cool}$ of the refrigerant, and the temperature $T_{LED-C}$ of the cooling water. In addition, the controller 14 controls the transparent heater 150 such that the temperature of each area A measured by the above-described temperature sensor (not shown) provided for each area A of the channel-forming member 130 becomes the temperature $T_H$ calculated for each region A.

Therefore, it possible to prevent the top plate 120 from being partially strongly heated to partially warp the top plate 120.

In the above-described example, the transparent heater 150 is used as a temperature adjustment part for controlling the temperature of the channel-forming member 130, but the temperature adjustment part is not limited thereto. For example, the temperature adjustment part may include a light source emitting light with a wavelength different from that from the LEDs 141, specifically, a light source emitting light with a wavelength absorbed by the channel-forming member 130, thereby heating the channel-forming member 130 with the light to adjust a temperature. In addition, when the temperature adjustment part is for cooling the channel-forming member 130, the rear surface of the channel-forming member 130 may be cooled by a gas capable of transmitting light (carbon dioxide ($CO_2$) gas, or the like). In this case, a cooling gas such as a carbon dioxide ($CO_2$) gas is supplied to the concave portion 142a of the base 142. Therefore, the LEDs 141 can also be cooled by the cooling gas, thereby extending the lifetime of the LEDs 141.

For example, in the above-described example, a refrigerant groove is formed on a rear surface of a top plate, and the refrigerant groove is covered with a channel-forming member to form a refrigerant channel. Instead of this, a refrigerant groove may be formed in a surface of a channel-forming member, and the refrigerant groove may be covered with a flat plate-shaped top plate to form a refrigerant channel.

When the warpage of the wafer W can adversely affect a processing result, the substrate support according to the present disclosure may be provided in a device other than a test device such as a prober, for example, a film forming device, an etching device, a doping device, or the like.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

The invention claimed is:

1. A substrate support for placing a substrate, the substrate support comprising:
 a top plate portion having a surface on which a substrate is placed;
 a light irradiation mechanism that includes a plurality of light-emitting elements, is disposed to face the substrate placed on the top plate portion, and heats the substrate using light emitted from the light-emitting elements;
 a channel-forming member that transmits the light emitted from the light-emitting elements and is directly bonded to a rear surface of the top plate portion so as to be interposed between the top plate portion and the light irradiation mechanism, wherein refrigerant channels are formed between the channel-forming member and the top plate portion, a refrigerant, which transmits the light emitted from the light-emitting elements, flows through the refrigerant channels, and the top plate portion and the channel-forming member are made of materials having different thermal expansion coefficients;
 a temperature adjustment part configured to adjust a temperature of the channel-forming member;
 a cooling unit configured to cool a driving unit for driving the light-emitting elements using a refrigerant; and
 a controller configured to control the temperature adjustment part,
 wherein the controller controls the temperature adjustment part such that the channel-forming member is at a temperature at which the top plate portion is not warped, and said temperature is calculated based on a temperature of the top plate portion, a temperature of the refrigerant of the refrigerant channel and a temperature of the refrigerant of the cooling unit.

2. The substrate support of claim 1, further comprising a controller configured to control the temperature adjustment part,
 wherein the controller controls the temperature adjustment part such that the channel-forming member is at a temperature at which the top plate portion is not warped, and said temperature is predetermined for each operating condition of the substrate support.

3. The substrate support of claim 2, wherein the temperature adjustment part is a resistance heating heater made of a light-transmitting material and is provided on a surface of the channel-forming member opposite to the top plate portion or inside the channel-forming member.

4. The substrate support of claim 3, wherein the resistance heating heater is made of indium tin oxide (ITO), indium zinc oxide (IZO), zinc oxide (ZnO), or indium gallium zinc oxide (IGZO).

5. The substrate support of claim 1, wherein the temperature adjustment part is a resistance heating heater made of a light-transmitting material and is provided on a surface of the channel-forming member opposite to the top plate portion or inside the channel-forming member.

6. The substrate support of claim 5, wherein the resistance heating heater is made of indium tin oxide (ITO), indium zinc oxide (IZO), zinc oxide (ZnO), or indium gallium zinc oxide (IGZO).

7. A test device comprising a substrate support for placing a substrate, the substrate support comprising:
 a top plate portion having a surface on which a substrate is placed;
 a light irradiation mechanism that includes a plurality of light-emitting elements, is disposed to face the substrate placed on the top plate portion, and heats the substrate using light emitted from the light-emitting elements;
 a channel-forming member that transmits the light emitted from the light-emitting elements and is directly bonded to a rear surface of the top plate portion so as to be interposed between the top plate portion and the light irradiation mechanism, wherein refrigerant channels are formed between the channel-forming member and the top plate portion, a refrigerant, which transmits the light emitted from the light-emitting elements, flows through the refrigerant channels, and the top plate portion and the channel-forming member are made of materials having different thermal expansion coefficients;
 a temperature adjustment part configured to adjust a temperature of the channel-forming member;
 a cooling unit configured to cool a driving unit for driving the light-emitting elements using a refrigerant; and
 a controller configured to control the temperature adjustment part,
 wherein the controller controls the temperature adjustment part such that the channel-forming member is at a temperature at which the top plate portion is not warped, and said temperature is calculated based on a temperature of the top plate portion, a temperature of the refrigerant of the refrigerant channel and a temperature of the refrigerant of the cooling unit,
 the test device configured to test electrical characteristics of the substrate placed on the top plate portion by making a plurality of contact terminals be in contact with the substrate.

8. A method of suppressing warpage of a substrate support on which a substrate is placed,
 the substrate support including:
 a top plate portion having a surface on which a substrate is placed;
 a light irradiation mechanism that includes a plurality of light-emitting elements, is disposed to face the substrate placed on the top plate portion, and heats the substrate using light emitted from the light-emitting elements;
 a channel-forming member that transmits the light emitted from the light-emitting elements and is directly bonded to a rear surface of the top plate portion so as to be interposed between the top plate portion and the light irradiation mechanism, wherein refrigerant channels are formed between the channel-forming member and the top plate portion, a refrigerant, which transmits the light emitted from the light-emitting elements, flows through the refrigerant channels, and the top plate portion and the channel-forming member are made of materials having different thermal expansion coefficients;
a temperature adjustment part configured to adjust a temperature of the channel-forming member;
a cooling unit configured to cool a driving unit for driving the light-emitting elements using a refrigerant; and
a controller configured to control the temperature adjustment part,
the method comprising: adjusting a temperature of the channel-forming member by the controller controlling the temperature adjustment part such that the channel-forming member is at a temperature at which the top plate portion is not warped, said temperature being calculated based on a temperature of the top plate portion, a temperature of the refrigerant of the refrigerant channel and a temperature of the refrigerant of the cooling unit.

* * * * *